United States Patent
Choi et al.

(10) Patent No.: US 7,750,343 B2
(45) Date of Patent: Jul. 6, 2010

(54) ELECTRONIC DEVICE HAVING AN ACTIVE LAYER INCLUDING INORGANIC SEMICONDUCTOR FINE PARTICLES COVERED WITH A PROTECTIVE LAYER AND PRODUCING METHOD THEREOF

(75) Inventors: Myung-Seok Choi, Kanagawa (JP); Shintaro Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 244 days.

(21) Appl. No.: 11/843,450

(22) Filed: Aug. 22, 2007

(65) Prior Publication Data

US 2008/0149921 A1    Jun. 26, 2008

(30) Foreign Application Priority Data

Aug. 22, 2006   (JP) .................... P2006-225489

(51) Int. Cl.
*H01L 51/00* (2006.01)
*H01L 35/24* (2006.01)

(52) U.S. Cl. .......... 257/40; 257/E51.006; 257/E51.007; 438/99

(58) Field of Classification Search ................. 257/40, 257/E51.006, E51.007; 438/99
See application file for complete search history.

(56) References Cited

U.S. PATENT DOCUMENTS

| | | | | |
|---|---|---|---|---|
| 5,500,537 | A * | 3/1996 | Tsumura et al. .............. 257/40 |
| 7,057,206 | B2 * | 6/2006 | Halik et al. .................. 257/40 |
| 2003/0042850 | A1 * | 3/2003 | Bertram et al. ............. 313/504 |
| 2005/0056828 | A1 * | 3/2005 | Wada et al. .................. 257/40 |
| 2005/0189536 | A1 * | 9/2005 | Zschieschang et al. ...... 257/40 |
| 2005/0205851 | A1 * | 9/2005 | Sugawara et al. .......... 252/514 |
| 2005/0233546 | A1 * | 10/2005 | Oohata et al. .............. 438/458 |
| 2006/0014365 | A1 * | 1/2006 | Kugler et al. .............. 438/502 |

FOREIGN PATENT DOCUMENTS

JP    2005-502176    1/2005

OTHER PUBLICATIONS

W. U. Huynh et al. Science 2002, 295, pp. 2425-2427.
W. J. E. Beek et al. Adv. Func. Mater. 2005, 15, pp. 1703-1707.
V.L. Colvin et al. Nature 1994, 370 pp. 354-357.
S. Coe et al. Nature 2002, 420, pp. 800-803.
A. H. Mueller et al. Nano Lett. 2005, 5, pp. 1039-1044.
D. Yu et al. Science 2003, 300, pp. 1277-1280.
D.V. Talapin et al. Science 2005, 310, pp. 86-89.
M.A. Loi et al Adv. Func. Mat. 2006, 16, pp. 41-47.
X. Michalet et al. Science 2005, 307, pp. 538-544.

(Continued)

*Primary Examiner*—Thanh V Pham
*Assistant Examiner*—Duy T Nguyen
(74) *Attorney, Agent, or Firm*—K&L Gates LLP (57) ABSTRACT

Disclosed herein is an electronic device of a three-terminal type including, a control electrode, first and second electrodes, and an active layer provided between the first and second electrodes so as to face the control electrode with an insulating layer interposed therebetween, the active layer being formed from an aggregate of a composite material formed from inorganic semiconductor fine particles covered with a protective layer, the protective layer including an alkyl chain having, at one end thereof, a functional group bonded to an inorganic semiconductor fine particle and further having an organic semiconductor molecule bonded to the other end thereof.

24 Claims, 5 Drawing Sheets

OTHER PUBLICATIONS

J. Liu et al. J. Am. Chem. Soc. 2004, 126, pp. 6550-6551.
H. Skaff et. al. J. Am. Chem. Soc. 2004, 126, pp. 11322-11325.
A. Hepp et al. The American Physical Society, 2003, pp. 157406-1-4.
T. Sakanoue et al Appl. Phys. Lett., 84, 16, 2004, pp. 3037-3039.
C. Rost et al. Appl. Phys. Lett., 85, 9, 2004, pp. 1613-1615.

* cited by examiner

FIG.5

ELECTRONIC DEVICE HAVING AN ACTIVE LAYER INCLUDING INORGANIC SEMICONDUCTOR FINE PARTICLES COVERED WITH A PROTECTIVE LAYER AND PRODUCING METHOD THEREOF

CROSS REFERENCES TO RELATED APPLICATIONS

The present application claims priority to Japanese Patent Application JP 2006-225489 filed in the Japan Patent Office on Aug. 22, 2006, the entire contents of which is being incorporated herein by reference.

BACKGROUND

This present application relates to an electronic device which functions, for example, as a field effect transistor, a light emitting element or a solar cell and a producing method for the electronic device.

Recently, development of electronic devices which use a thin film of organic molecules has been and is being proceeded energetically. Among such electronic devices, attention is paid to organic electronics devices (which may hereinafter referred to simply as organic devices) such as organic transistors, organic light emitting elements and organic solar cells. Final targets of such organic devices are directed to reduction in cost, reduction in weight, achievement of flexibility and achievement of high performances, and it is considered that the key to the development is the physical properties of the organic materials. The organic materials have such various advantages that (1) a large-area organic device can be produced at a low cost through a simple and easy process at a low temperature; that (2) it is possible to produce a flexible organic device; and that (3) the performances or physical properties of an organic device can be controlled by modifying molecules of an organic material in a desired form.

However, some organic materials are liable to be oxidized, and when future placement into practical use is taken into consideration, organic materials are not satisfactory in terms of the chemical and physical stability. In this regard, it is considered that there is room for improvement in the organic materials. From such a point of view as just described, attention is paid recently to a hybrid material of organic and inorganic materials which has superior stability and physical properties of an inorganic semiconductor material and has applicability of a solution process provided by an organic semiconductor material.

From among such organic and inorganic hybrid materials as mentioned above, a composite material composed of mixture of semiconductor nano-grains and conjugate polymer is being investigated, and energetic investigations have been and are being made in various fields. As a result of such investigations, various proposals have been made. For example, a solar cell is disclosed in W. U. Huynh et al., Science 2002, 295, 2425, (hereinafter referred to as Non-Patent Document 1) or W. J. E. Beek et al., Adv. Func. Matter, 2005, 15, 1703 (hereinafter referred to as Non-Patent Document 2); a light emitting element is disclosed in V. L. Colvin et al., Nature 1994, 370, 354 (hereinafter referred to as Non-Patent Document 3), S. Coe et al., Nature 2002, 420, 800 (hereinafter referred to as Non-Patent Document 4), or A. H. Mueller et al., Nano Lett., 2005, 5, 1039 (hereinafter referred to as Non-Patent Document 5); and a field effect transistor is disclosed in D. Yu et al., Science 2003, 300, 1277 (hereinafter referred to as Non-Patent Document 6) or D. V. Talapin et al., Science 2005, 310, 86 (hereinafter referred to as Non-Patent Document 7).

However, where a composite material of mixture of semiconductor nano-grains and conjugate polymer is formed into a thin film, phase separation occurs between the semiconductor nano-grains and the conjugate polymer, for example, because of heat generated upon use of the organic device. Such phase separation makes a cause of deterioration of the performance of the organic device.

SUMMARY

Attention is paid also to research and development for harmonization or integration of such various organic devices as mentioned hereinabove, and an organic light emitting transistor wherein an electroluminescence function is incorporated in a transistor itself has been reported already. However, an organic light emitting transistor which can generate electricity has not been reported as yet. Such "multifunction organic devices" lead to simplification of circuitry, higher functionalization of elements and so forth and attract attention as next-generation elements.

Incidentally, in an organic light emitting transistor which is a three-terminal type organic light emitting element having a structure similar to that of a field effect transistor (FET), the material (hereinafter referred to as channel material for the convenience of description) from which a channel formation region is formed takes charge of a light emitting function based on storage of charge by modulation based on a gate voltage applied to the gate electrode and recombination of electrons and holes injected. As the channel material, organic semiconductor materials having p-type conductivity and ambipolar materials are used widely. In an organic light emitting transistor wherein an organic semiconductor material having the p-type conductivity is used as the channel material, the light emission intensity increases in proportion to the absolute value of drain current and can be modulated by the gate voltage and the voltage between the source and drain electrodes. However, such an organic light emitting transistor as just described has a problem that, since the mobility of electrons is very much lower than that of holes, electroluminescent light by recombination of electrons and holes is observed only in the proximity of the drain electrode. In order to improve the injection efficiency of electrons, investigations also for an organic light emitting transistor having a bulk hetero-junction structure have been made, and a report of the investigations is disclosed, for example, in M. A. Loi et al., Adv. Func. Mat., 2006, 16, 41 (hereinafter referred to as Non-Patent Document 8). However, where a bulk structure is employed, production of an aggregate of molecules, phase separation and so forth occur readily, which makes a cause of deterioration of the charge mobility or the light emission efficiency.

It is desirable to provide an electronic device which is chemically and physically stable and is stable in performance against a disturbance such as heat when it is used.

It is also desirable to provide an electronic device which has a configuration and structure capable of harmonizing a function as a transistor, a function as a light emitting element and function as a solar cell.

Further, it is desirable to provide a producing method for the electronic devices described above.

According to a first embodiment, there is provided an electronic device of a three-terminal type, including a control electrode, first and second electrodes, and an active layer provided between the first and second electrodes so as to face the control electrode with an insulating layer interposed therebetween, the active layer being formed from an aggregate of a composite material formed from inorganic semiconductor fine particles covered with a protective layer, the protective layer including an alkyl chain having, at one end thereof, a functional group bonded to an inorganic semiconductor fine particle and further having an organic semiconductor molecule bonded to the other end thereof.

Further, according to the first embodiment, there is provided a producing method for an electronic device of a three-terminal type including a control electrode, first and second electrodes, and an active layer provided between the first and second electrodes so as to face the control electrode with an insulating layer interposed therebetween, the active layer being formed from an aggregate of a composite material formed from inorganic semiconductor fine particles covered with a protective layer, the protective layer including an alkyl chain having, at one end thereof, a functional group bonded to an inorganic semiconductor fine particle and further having an organic semiconductor molecule bonded to the other end thereof, the producing method including the step of forming the active layer by application using solvent which contains the composite material.

The electronic device according to the first embodiment or a producing method therefor (hereinafter collectively referred to as the first embodiment) may be configured such that current to flow from the first electrode toward the second electrode through the active layer is controlled by the voltage applied to the control electrode. In this instance, the electronic device may include a field effect transistor whose gate electrode is the control electrode, whose source/drain electrodes are the first and second electrodes, whose gate insulating layer is the insulating layer and whose channel formation region is the active layer.

The electronic device may be formed as a light emitting element wherein the active layer emits light in response to application of a voltage to the control electrode and the first and second electrodes.

Or, the electronic device may be formed as a photo-electric conversion element wherein current flows between the first and second electrodes in response to irradiation of light upon the active layer. Where the electronic device is formed as a photo-electric conversion element, the photo-electric conversion element can be used to particularly form a solar cell or an image sensor. In this instance, a voltage may or may not be applied to the control electrode. Where a voltage is not applied to the control electrode, current to flow can be modified by application of a voltage to the control electrode.

According to a second embodiment, there is provided an electronic device of a two-terminal type, including first and second electrodes, and an active layer provided between the first and second electrodes, the active layer being formed from an aggregate of a composite material formed from inorganic semiconductor fine particles covered with a protective layer, the protective layer including an alkyl chain having, at one end thereof, a functional group combined to an inorganic semiconductor fine particle and further having an organic semiconductor molecule combined to the other end thereof, the active layer generating electric power in response to light irradiated thereupon.

According to a third embodiment, there is provided an electronic device of a two-terminal type, including first and second electrodes, and an active layer provided between the first and second electrodes, the active layer being formed from an aggregate of a composite material formed from inorganic semiconductor fine particles covered with a protective layer, the protective layer including an alkyl chain having, at one end thereof, a functional group combined to an inorganic semiconductor fine particle and further having an organic semiconductor molecule combined to the other end thereof, the active layer emitting light in response to application of a voltage to the first and second electrodes.

According to the second and third embodiments, there is provided a producing method for an electronic device of a two-terminal type which includes first and second electrodes and an active layer provided between the first and second electrodes, the active layer being formed from an aggregate of a composite material formed from inorganic semiconductor fine particles covered with a protective layer, the protective layer including an alkyl chain having, at one end thereof, a functional group combined to an inorganic semiconductor fine particle and further having an organic semiconductor molecule combined to the other end thereof, the active layer being operable to generate electric power in response to light irradiated thereupon or emit light in response to application of a voltage to the first and second electrodes, the producing method including the step of forming the active layer by application using solvent which contains the composite material.

The electronic device according to the second embodiment or a producing method according to the second embodiment (hereinafter those may be collectively called the second embodiment of the application) functions as a solar cell. In this instance, the first electrode may be made of a metal having a high work function (for example, $\phi$=4.5 eV to 5.5 eV) while the second electrode is made of a metal having a low work function (for example, $\phi$=3.5 eV to 4.5 eV). It is to be noted that, where the electronic device is configured in this manner, it is desirable from a point of view of enhancement of the power generation efficiency to use a vertical device structure wherein the second electrode, active layer and first electrode are successively formed on a support member. Here, the metal having a low work function for the second electrode may be aluminum (Al) whose work function is 4.19 eV or magnesium (Mg) whose work function is 3.61 eV. Where such metal is used, electrons generated in the active layer are injected readily into the second electrode. It is to be noted that the structure of the electronic device is not limited to the vertical structure, but may otherwise be a horizontal structure wherein the first and second electrodes are formed on a support member and the active layer is formed at a portion of the support member which is positioned between the first and second electrodes. In those cases, where the organic semiconductor molecule has the p-type conductivity, the material for the first electrode may be selected from among those conductive materials which have a work function comparatively proximate to the energy level which the HOMO (Highest Occupied Molecular Orbital) of the organic semiconductor molecule has. For example, gold (Au) or silver (Ag) may be used, or ITO which is used to form a transparent electrode or STO may be used. Further, also the first and second electrodes where the photo-electric conversion of the electronic device according to the first embodiment is formed so as to function as a solar cell are preferably made of one of the materials mentioned above.

In the electronic device according to the first to third embodiments or the producing method according to the first or the second embodiment (hereinafter those may be collectively called simply the present application), the alkyl chain may be a straight alkyl chain, or more particularly —$(CH_2)_n$— where n is an integer ranging from 3 to 18. It is to be noted that the alkyl chain may be replaced by insulating organic molecules having a form of a chain.

The inorganic semiconductor fine particles may have the n-type conductivity and the organic semiconductor molecule may have the p-type conductivity.

The electronic device according to the first to third embodiments may be configured such that the organic semiconductor molecule is formed from a compound selected from a group of a condensation polycyclic aromatic compound, porphyrin-based derivative, a phenylvinyliden type conjugate oligomer and a thiophene type conjugate oligomer. Or, the electronic device according to the first to third embodiments may be configured such that the functional group provided at the one end of the alkyl chain is a compound selected from a group of a thiol radical —SH, an amino group —NH$_2$, a cyano radical —NC, a carboxyl radical —COOH, a phosphoric radical and a phosphine oxide group —P=O. In particular, for the organic semiconductor molecule, condensation polycyclic aromatic compound such as acene-based molecules (pentacene, tetracene or the like), porphyrin-based molecules and conjugate oligomer (phenylvinyliden type, thiophene type and so forth) may be used.

It is to be noted that the protective layers which form the outer shell of the composite material contact with each other. More particularly, the organic semiconductor molecule of the protective layer which forms the outer shell of a composite material and the organic semiconductor molecule of the protective layer which forms the outer shell of another composite material which is positioned adjacent the former composite material have π interaction. In other words, the π electrons of the composite materials overlap with each other.

Further, the electronic device according to the first to third embodiments may be configured such that the inorganic semiconductor fine particles are fine particles of at least one kind selected from a group of CdS, CdSe, ZnS, CdSe/CdS, CdSe/ZnS, PbSe, ZnO, TiO$_2$ (titanium oxide), SnO$_2$ (tin oxide), CdTe (cadmium telluride), GaAs (gallium arsenide), Si (silicon) and SiO$_X$ (silicon oxides). Although the range of the average particle size R$_{AVE}$ of the inorganic semiconductor fine particles is not limited particularly, it may be within a range $5.0\times10^{-10}$ m≦R$_{AVE}$≦$1.0\times10^{-6}$ m, or more preferably within $5.0\times10^{-10}$ m≦R$_{AVE}$≦$1.0\times10^{-7}$ m, most preferably within $5.0\times10^{-10}$ m≦R$_{AVE}$≦$1.0\times10^{-8}$ m. Further, the light emission band of the inorganic semiconductor fine particles preferably remains within the visible light range from 380 nm to 800 nm. Although the inorganic semiconductor fine particles may have a spherical shape, the shape thereof is not limited to this but may otherwise be, for example, a triangular shape, a tetrahedral shape, a cubic shape, a parallelepiped shape, a conical shape, a circular cylindrical (rod) shape, a triangular pole shape, a fiber shape or a pilling-like fiber shape. It is to be noted that the average particle size R$_{AVE}$ of the inorganic semiconductor fine particles where the inorganic semiconductor fine particles have a shape other than the spherical shape may be determined such that a sphere having a volume equal to a measured volume of an inorganic semiconductor fine particle of a shape other than the spherical shape is supposed and an average of the diameter of such spheres is determined as the average particle size R$_{AVE}$ of the inorganic semiconductor fine particles. The average particle size R$_{AVE}$ of the inorganic semiconductor fine particles can be obtained, for example, by measuring the particle size of inorganic semiconductor fine particles observed using a transmission type electron microscope (TEM).

As the method for the application in the producing method for an electronic device according to the first to third embodiments, spin coating, immersion, casting, various printing methods such as screen printing, ink jet printing, offset printing and gravure printing, stamping, spraying, and various coating methods such as air doctor coating, blade coating, rod coating, knife coating, squeeze coating, reverse roll coating, transfer roll coating, gravure coating, kiss coating, cast coating, spray coating, slit orifice coating and calendar coating may be used. Further, as the solvent for the solution containing the composite material, organic solvents having no polarity or low polarity such as toluene, chloroform, hexane and ethanol can be used. The solvent containing the composite material can be prepared typically by the following method. In particular, inorganic semiconductor fine particles coated with a protective layer precursor are prepared. Here, the protective layer precursor is composed of an alkyl chain having, at one end thereof, a functional group bonded to an inorganic semiconductor fine particle and, at the other end thereof, a functional group which is finally replaced by an organic semiconductor molecule. Then, the inorganic semiconductor fine particles covered with the protective layer precursor are thrown into and mixed with organic solvent in which organic semiconductor molecule is dissolved. As a result, the functional group at the other end of the alkyl chain is replaced by an organic semiconductor molecule. The solvent containing the composite material can be obtained in this manner. Or, the solvent which contains the composite material can be obtained also by performing synthesis of inorganic semiconductor fine particles using alkyl chain whose organic semiconductor molecule is replaced already (molecules which form the alkyl chain have a functional group which can be bonded to an inorganic semiconductor fine particle).

In the first embodiment, where the electronic device is formed as a field effect transistor (FET), the field effect transistor may be of the bottom gate/bottom contact type, bottom gate/top contact type, top gate/bottom contact type or top gate/top contact type. It is to be noted that the active layer is formed on a substrate by application using the solution which contains the composite material.

More particularly, the field effect transistor of the bottom gate/bottom contact type includes (a) a gate electrode formed on a substrate, (b) a gate insulating film (corresponding to a base) formed on the gate electrode and the substrate, (c) a pair of source/drain electrodes formed on the gate insulating film, and (d) a channel formation region formed from an active layer on the gate insulating film between the source/drain electrodes.

The field effect transistor of the bottom gate/top contact type includes (a) a gate electrode formed on a substrate, (b) a gate insulating film (corresponding to a base) formed on the gate electrode and the substrate, (c) a channel formation region forming layer formed on the gate insulating film and including a channel formation region formed from an active layer, and (d) a pair of source/drain electrodes formed on the channel formation region forming layer.

The field effect transistor of the top gate/bottom contact type includes (a) a pair of source/drain electrodes formed on a base, (b) a channel formation region formed on the base between the source/drain electrodes and formed from an active layer, (c) a gate insulating film formed on the source/drain electrodes and the channel formation region, and (d) a gate electrode formed on the gate insulating film.

The field effect transistor of the top gate/top contact type includes (a) a channel formation region forming layer formed on a base and including a channel formation region formed from an active layer, (b) a pair of source/drain electrodes formed on the channel formation region forming layer, (c) a gate insulating film formed on the source/drain electrodes and the channel formation region, and (d) a gate electrode formed on the gate insulating film.

It is to be noted that, where the electronic device according to the first embodiment is formed as a light emitting element or a photo-electric conversion element, the configuration or structure of the light emitting element or photo-electric conversion element may be any of the four different configurations or structures of the field effect transistor described above.

The base or the support member in the second embodiment (hereinafter those may be collectively called base etc.) may be formed from a silicon oxide type material such as, for example, $SiO_X$ or spin-on-glass, silicon nitride ($SiN_Y$), aluminum oxide ($Al_2O_3$) or a metal oxide high-dielectric insulating film. Where the base or support member is formed from any of the materials mentioned, it may be formed on or above a substrate formed from a material selected from the following materials. In particular, the substrate or the base or support member other than the base or support member described above may be formed from organic polymer such as polymethyl methacrylate (PMMA), polyvinyl alcohol (PVA), polyvinyl phenol (PVP), polyethersulfone (PES), polyimide, polycarbonate (PC) or polyethylene terephthalate (PET), which may be in the form of a macromolecular material such as a plastic film, a plastic sheet or a plastic substrate formed from a macromolecular material and having flexibility. If a base or support member made of any of such macromolecular materials having flexibility as mentioned above is used, then incorporation or integration of an electronic device into or with a display apparatus or an electronic apparatus which has, for example, a curved face configuration can be achieved. Or, for the substrate or the base or support member, various glass substrates, various glass substrates having an insulating film formed on the surface thereof, quartz substrates, quartz substrates having an insulating film form on the surface thereof and silicon substrates having an insulating film formed on the surface thereof may be used. For the insulating substrate, a suitable one of the materials listed as above may be selectively used. For the substrate, also conductive substrates such as substrates made of metal such as gold or aluminum and substrates made of high-orientation graphite may be used.

As the material to be used to form the control electrode and the first and second electrodes as well as various wiring lines in the electronic device according to the first embodiment, metal materials such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co) and molybdenum (Mo), alloys which contain such metal elements, conductive particles made of such metals, conductive particles of alloys containing such metals and conductive substances such as silicon which contain some impurity may be used. Also a lamination structure of layers which contain such elements may be used. Further, as the material to be used to form the control electrode and the first and second electrodes as well as various wiring lines in the electronic device according to the first embodiment, organic materials (conductive macromolecules) such as poly-(3,4-ethelene dioxythiophene)/poly(styrene sulfonate) [PEDOT/PSS] may be used.

As the method for forming the control electrode and the first and second electrodes as well as various wiring lines in the electronic device according to the present application, any of physical vapor deposition (PVD), various chemical vapor deposition methods (CVD) including MOCVD, spin coating, immersion, casting, various printing methods mentioned hereinabove, stamping, various coating methods mentioned hereinabove, a liftoff method, a sol-gel method, electrodeposition, a shadow mask method, plating such as electroplating and electroless plating or a combination of them, and spraying may be used, depending on materials included. As occasion demands, any of the methods mentioned may be used in combination with a patterning technique. It is to be noted that, as the PVD method, (a) various vacuum deposition methods such as electron beam heating, resistance heating and flash deposition, (b) plasma-enhanced vapor deposition, (c) various sputtering methods such as double-pole sputtering, dc sputtering, dc magnetron sputtering, high-frequency sputtering, magnetron sputtering, ion beam sputtering and bias sputtering and (d) various ion plating methods such as a DC (direct current) method, a RF method, a multi-cathode method, an activation reaction method, an electric field vapor deposition method, a radio frequency ion plating method and a reactive ion plating method may be used.

Further, as the material for the insulating layer, which sometimes corresponds to the base or the gate insulating film in the electronic device according to the first embodiment, not only inorganic insulating materials as represented by metal oxide high-dielectric insulating films of silicon oxide, silicon nitride ($SiN_Y$) and aluminum oxide ($Al_2O_3$) but also organic insulating materials (organic polymers) represented by polymethyl methachrylate (PMMA), polyvinyl phenol (PVP), polyvinyl alcohol (PVA), polyimide, polycarbonate (PC), polyethylene terephthalate (PET), polystyrene, silanol derivatives (silane coupling agents) such as N-2 (aminoethyl) 3-aminopropyl-trimethoxysilane (AEAPTMS), 3-mercaptopropyl-trimethoxysilane (MPTMS) and octadecil trichlorosilane (OTS) and straight chain hydrocarbons having, at an end thereof, a function group which can bonded to the control electrode such as octadecanthiol and dodecyl isocyanate may be used. The materials mentioned may be used also in suitable combinations. It is to be noted that, as the silicon oxide type materials, silicon oxide ($SiO_X$), BPSG, PSG, BSG, AsSG, PbSG, silicon oxynitride (SiON), SOG (spin-on glass), and low dielectric constant $SiO_2$ type materials such as polyaryl ether, cyclo-perfluorocarbon polymer, benzo-cyclobutene, cyclic fluorocarbon resin, polytetrafluoroethylene, arylfluoride ether, polyimide fluoride, amorphous carbon and organic SOG may be used.

Further, as the method of forming the insulating layer or the gate insulating film, such various PVD methods, CVD methods, spin coating method, various printing methods, various coating methods, immersion method, casting method, zol-gel method, electrodeposition method, shadow mask method and spray method as described hereinabove may be used. Or, the insulating layer or the gate insulating film may be formed also by oxidizing or nitriding the surface of the control electrode or may be obtained by forming an oxide film or a nitride film on the surface of the control electrode. As the method of oxidizing the surface of the control electrode, an oxidization method using $O_2$ plasma or an anodic oxidation method may be used although it depends upon the material of the control electrode. Meanwhile, as the method of nitriding the surface of the control electrode, a nitriding method using $N_2$ plasma may be used although it depends upon the material of the control electrode. Or else, it is possible to form an insulating layer on the surface of the control electrode or form the gate insulating film by coating the surface of the control electrode in a self-organizing manner by such a method as immersion with insulating molecules having a function group which can form a chemical bond to the control electrode like, for example, to an Au electrode, straight chain hydrocarbon modified one end thereof with a mercapto group. Or else, the insulating layer or the gate insulating film may be formed by modifying the surface of the control electrode with a silanol derivative (silane coupling agent).

Where the electronic device is applied to or used with display apparatus or various electronic apparatus, a large number of electronic devices may be integrated on a substrate to form a monolithic integrated circuit, or such electronic devices may be cut so as to be individualized and used as discrete parts. Further, the electronic device or devices may be encapsulated using a resin material.

Usually, in an organic semiconductor material, for example, for a channel formation region of a field effect transistor, a one-dimensional (that is, in a direction from the first electrode toward the second electrode) or two-dimensional (that is, in a direction from the first electrode to the second electrode and a thicknesswise direction of the channel formation region) stable molecule array is essentially required for the transmission of the carriers. If the molecule array is disturbed, then the performance of the electronic device is deteriorated. On the other hand, in the present application, the active layer is composed of an aggregate of a composite material formed from inorganic semiconductor fine particles covered with a protective layer. Thus, it can be considered that, when the active layer is viewed with reference to the inorganic semiconductor fine particle, it has a kind of 0-dimensional molecule array (or an array of molecules three-dimensionally arrayed at random). Accordingly, the structure of the active layer is less likely to be disturbed by a stimulus from the outside.

In the electronic device according to the first embodiment, where the inorganic semiconductor fine particles have the n-type conductivity and the organic semiconductor molecule has the p-type conductivity, if a predetermined voltage is applied to the first and second electrodes and a voltage is applied to the control electrode, then an accumulation layer of successive holes is formed in the active layer while electrons are injected, for example, from the second electrode into the inorganic semiconductor fine particles. Then, the electrons are transmitted through the inorganic semiconductor fine particles by hopping and finally arrive at, for example, the first electrode. In this manner, in the electronic device according to the first embodiment, the current to flow through the active layer can be controlled, for example, by applying a voltage to the control electrode. In other words, the electronic device can exhibit a function as a field effect transistor.

Or, in the electronic device according to the first embodiment, where the inorganic semiconductor fine particles have the n-type conductivity and the organic semiconductor molecule has the p-type conductivity, electrons are injected, for example, from the second electrode into the inorganic semiconductor fine particles and spread over the overall active layer depending upon the voltage application state to the first and second electrodes. On the other hand, by the injection of carriers (holes or electrons), a strong electric field is generated on the interface between the inorganic semiconductor fine particles and the organic semiconductor molecule. Thus, the holes are injected from the organic semiconductor molecule into the inorganic semiconductor fine particles, whereupon excitons are generated and then re-combined immediately to generate fluorescent light. In this manner, In the electronic device according to the first embodiment, the functions as a light emitting element are exhibited by applying a voltage to the control electrode and the first and second electrodes. Here, the color of light emission depends upon the particle size of the inorganic semiconductor fine particles or depends upon the voltage application state (bias) to the first and second electrodes. In particular, since the band gap differs depending upon the particle size of the inorganic semiconductor fine particles, if the particle size of the inorganic semiconductor fine particles differs, then also the color of light emission differs. Or, whether holes are injected into the fine particles or electrons are injected into the organic semiconductor molecule through the interface between the organic semiconductor molecules and the inorganic semiconductor fine particles depends upon the voltage application state (bias) to the first and second electrodes. By this, the generation location of excitons (fine particle side or organic semiconductor molecule side) can be selected, and the color of light emission varies also depending on this. Accordingly, the color of light emission can be controlled by controlling the voltage application state (bias) to the first and second electrodes or by disposing the composite material formed from inorganic semiconductor fine particles having a desired particle size in a desired region. Consequently, a light emitting element can be provided which exhibits a high luminance and a high fluorescent light yield and is easy to inject electrons into the second electrode and high in electron mobility.

Whether the electronic device according to the first embodiment exhibits functions as a field effect transistor or as a light emitting element depends upon the voltage application state (bias) to the first and second electrodes. First, if a bias within a range within which electron injection from the second electrode into the inorganic semiconductor fine particles does not occur is applied and the control electrode is modulated, then current flows from the first electrode to the second electrode. This is transistor operation. On the other hand, if holes are accumulated sufficiently and the bias to the first and second electrodes is increased, then electron injection into the inorganic semiconductor fine particles begins, and light is emitted by re-combination of the electrons with the holes.

It is to be noted that, with the electronic device according to the first embodiment, a photo-electric conversion element can be configured wherein current flows between the first and second electrodes in response to irradiation of light upon the active layer. Accordingly, if the material for the active layer is designed and selected suitably, then it is possible for a single electronic device to exhibit functions of three different electronic devices as a photo-electric conversion element including an organic solar cell, an organic transistor and an organic light emitting element.

Meanwhile, in the second embodiment, the composite material formed from inorganic semiconductor fine particles covered with a protective layer and forming the active layer has an interface potential at a pn junction portion and involves a barrier field. Here, if light is irradiated upon the active layer, then holes and electrons generated in the composite material are separated from each other by the electric field, whereby a potential difference (photoelectromotive force) is generated. Where the inorganic semiconductor fine particles have the n-type conductivity and the organic semiconductor molecule has the p-type conductivity, the generated holes are transmitted through the organic semiconductor molecule in the protective layer which forms an outer shell of the composite material and finally come to the first electrode similarly as described hereinabove. Meanwhile, the electrons are transmitted through the inorganic semiconductor fine particles by hopping and finally arrive at the second electrode. In this manner, in the electronic device of the second embodiment, when light is irradiated upon the active layer, electric power (photoelectromotive force) is generated. Consequently, the electronic device can exhibit functions as a solar cell which is very high in efficiency in charge separation and low in production probability of energy traps. Further, since the inorganic semiconductor fine particles having the n-type conductivity can themselves inject electrons directly into the second electrode from an optical excited state, the efficiency of the light sensitization action to the sunlight can be further raised.

The electronic device according to the third embodiment functions as a light emitting element wherein the active layer emits light in response to application of a voltage to the first and second electrodes. In the electronic device according to the third embodiment, where the inorganic semiconductor fine particles have the n-type conductivity and the organic semiconductor molecule has the p-type conductivity, electrons are injected into the inorganic semiconductor fine particles, for example, from the second electrode depending upon the voltage application state to the first and second electrodes. The injected electrons are transmitted through the inorganic semiconductor fine particles by hopping and spread over the overall active layer. Meanwhile, when holes are inputted from the first electrode into the organic semiconductor molecule, an intense electric field is generated on the interface between the inorganic semiconductor fine particles and the organic semiconductor molecule as a result of the injection of the carriers (holes and electrons). Consequently, the holes are injected from the inorganic semiconductor fine particles into the organic semiconductor molecule, whereupon excitons are generated and then recombined immediately to generate fluorescent light.

Further, in the present application, since the active layer is formed from an aggregate of a composite material formed from inorganic semiconductor fine particles covered with a protective layer, a pn junction structure on the molecule level is formed. Consequently, phase separation between the organic molecules and the fine particles does not occur, different from the past technology, and enhancement of the electron movement efficiency on the pn junction interface can be achieved. Further, in the present application, since the active layer is formed from an aggregate of a composite material formed from inorganic semiconductor fine particles covered with a protective layer, a pn junction structure of the covalent bond is formed. Consequently, phase separation between the organic molecules and the fine particles does not occur, different from the past technology, and enhancement of the charge separation efficiency can be achieved by increasing the contact area between the p-type region and the n-type region.

Additional features and advantages are described herein, and will be apparent from, the following Detailed Description and the figures.

DETAILED DESCRIPTION

In the following, the present application is described in more detail in connection with embodiments thereof with reference to the accompanying drawings.

Embodiment 1

In an embodiment, an electronic device of a three-terminal type and a producing method of the electronic device are provided. The electronic device includes (A) a control electrode, (B) first and second electrodes, and

(C) an active layer provided between the first and second electrodes so as to face the control electrode with an insulating layer interposed therebetween.

Figure 1A:
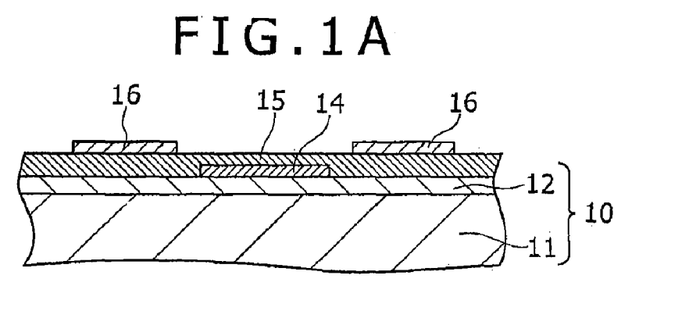
FIGS. 1A and 1B are schematic partial cross sectional views of a substrate and associated components of an electronic device to which an embodiment is applied illustrating an outline of a producing process of the electronic device.
Figure 1B:
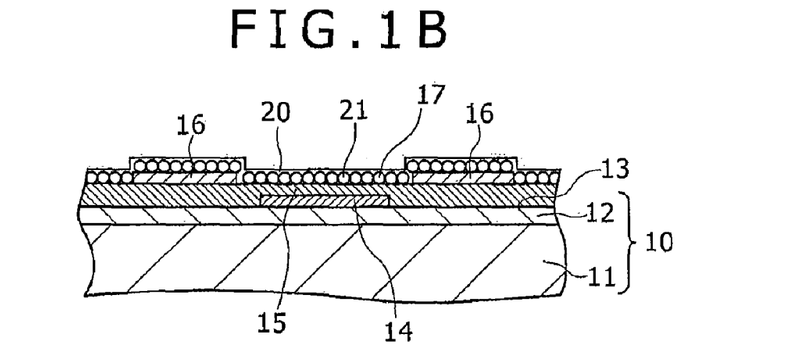
Figure 1C:
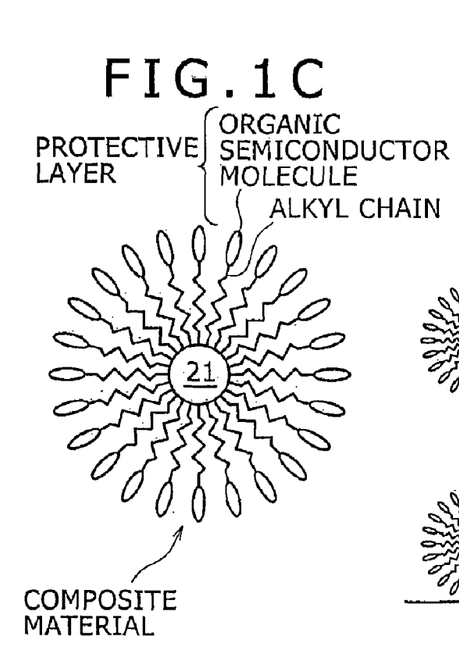
FIG. 1C is a schematic view illustrating a concept of a composite material formed from inorganic semiconductor fine particles covered with a protective layer.
Figure 1D:
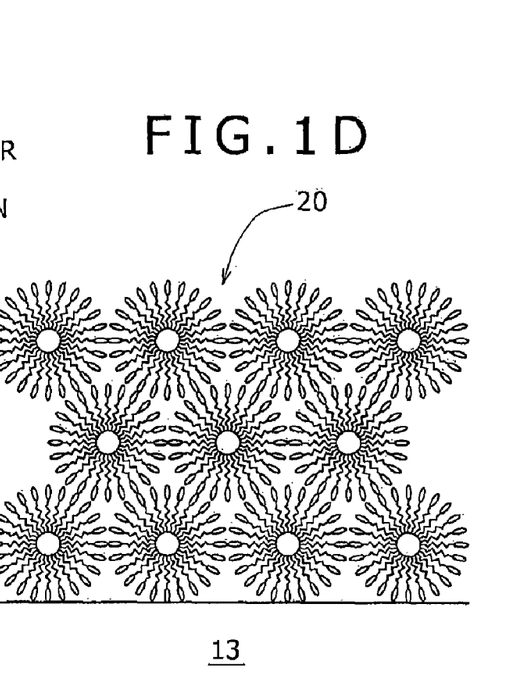
FIG. 1D is a schematic view illustrating a concept of an active layer.

Referring first to FIG. 1D, the active layer 20 is schematically shown. The active layer 20 is formed from an aggregate of the composite material shown in FIG. 1C formed from an inorganic semiconductor fine particle 21 covered with a protective layer. The protective layer is composed of alkyl chain having, at one end thereof, a functional group combined to the inorganic semiconductor fine particle 21 and an organic semiconductor molecule combined to the other end of each alkyl chain. The inorganic semiconductor fine particle 21 is formed from a fine particle of at least one kind selected from a group of CdS, CdSe, ZnS, CdSe/CdS, SdSe/ZnS, PbSe, ZnO, titanium oxide ($TiO_2$), tin oxide ($SnO_2$), cadmium telluride (CdTe), gallium arsenide (GaAs), silicon (Si) and silicon oxides ($SiO_x$) which have the n-type conductivity and an average particle diameter $R_{AVE}$ which satisfies $5.0 \times 10^{-10}$ m $\leq R_{AVE} \leq 1.0 \times 10^{-7}$ m. On the other hand, the alkyl chain is $-(CH_2)_n-$ where n=3 to 18 and has, at an end thereof, a functional group selected from a group of a thiol radical (—SH), an amino group (—$NH_2$), a cyano radical (—NC), a carboxyl radical (—COOH), a phosphoric radical and a phosphine oxide group (—P=O). Further, as the organic semiconductor molecule which is combined to the other end of the alkyl chain and have the p-type conductivity, those of condensation polycyclic aromatic compound such as acene-based molecules (pentacene, tetracene or the like), porphyrin-based molecules and conjugate oligomer (phenylvinyliden type, thiophene type and so forth) may be used. Several examples of the structural formula of organic semiconductor molecule are listed below. It is to be noted that, in the expressions (1) to (8), n is an integer, for example, within a range from 3 to 18. Further, in the embodiment 1 or any of embodiments 2 to 6 hereinafter described, it is necessary to select the alkyl chain having a functional group and an organic semiconductor molecule so that the distance between inorganic semiconductor fine particles, in particular, twice the sum of the length of an alkyl chain having a functional group and the length of an organic semiconductor molecule, may be such as allows movement of an electron between the inorganic semiconductor fine particles by hopping.

-continued

Formula (8)

Porphyrin (8)

n = 3~18
R = $C_aH_{2a+1}$ (a = 3~ 8)
M = 2H, Zn, Mg, Cu, Fe, Co

More particularly, the electronic device of the embodiment 1 is a field effect transistor (FET) wherein the current flowing from the first electrode to the second electrode along the active layer is controlled by the voltage applied to the control electrode. Thus, the control electrode corresponds to the gate electrode while the first and second electrodes correspond to the source/drain electrodes, and the insulating layer corresponds to the gate insulating film and the active layer corresponds to the channel formation region. In particular, as seen in FIG. 1B, the electronic device of the embodiment is a field effect transistor, more particularly, a thin film transistor (TFT), of the bottom gate/bottom contact type and includes (a) a gate electrode 14 (corresponding to the control electrode) formed on a substrate 10, (b) a gate insulating film 15 (corresponding to the insulating layer and further to a base 13) formed on the gate electrode 14 and the substrate 10, (c) a pair of source/drain electrodes 16 (corresponding to the first and second electrodes) formed on the gate insulating film 15, and (d) a channel formation region 17 formed from an active layer 20 on the gate insulating film 15 between the source/drain electrodes 16.

In the following, an outline of a producing method for the electronic device (field effect transistor) of the embodiment 1 is described with reference to FIGS. 1A and 1B.

It is to be noted that solution which contains the composite material is prepared in advance. In particular, inorganic semiconductor fine particles covered with a protective layer precursor are prepared. Here, the protective layer precursor is composed of an alkyl chain having, at one end thereof, a functional group bonded to an inorganic semiconductor fine particle and, at the other end thereof, a functional group (more particularly, for example, —COOH, —NH$_2$ or —OH) which is finally replaced by an organic semiconductor molecule as described hereinabove. Then, the inorganic semiconductor fine particles covered with the protective layer precursor are thrown into and mixed with organic solvent in which organic semiconductor molecule is dissolved (medium: popular organic solvent such as chloroform, dichloromethane, THF or toluene). As a result, the functional group at the other end of the alkyl chain is replaced by an organic semiconductor molecule. Solvent which contains the composite material can be obtained in this manner. Or, solvent containing the composite material can be obtained also by performing synthesis of inorganic semiconductor fine particles using alkyl chain whose organic semiconductor molecule is replaced already (molecules which form the alkyl chain have a functional group which can be bonded to an inorganic semiconductor fine particle) to obtain the composite material and then introducing the obtained composite material into organic solvent.

[Step-100]

First, a gate electrode 14 is formed on a substrate 10. In particular, a resist layer (not shown) from which a portion at which a gate electrode 14 is to be formed is removed is formed by lithography on an insulating film 12 formed on the surface of a glass substrate 11 and made of SiO$_2$. Thereafter, a titanium (Ti) layer (not shown) as an adhesion layer and a gold (Au) layer as a gate electrode 14 are successively formed over the overall area by vacuum deposition, whereafter the resist layer is removed. In this manner, the gate electrode 14 can be obtained by a liftoff method.

[Step-110]

Then, a gate insulating film 15 corresponding to the base 13 is formed on the substrate 10 including the gate electrode 14, or more particularly, on the insulating film 12 formed on the surface of the glass substrate 11. In particular, a gate insulating film 15 made of SiO$_2$ is formed on the gate electrode 14 and the insulating film 12 by sputtering. When the formation of the gate insulating film 15 is performed, part of the gate electrode 14 may be covered with a hard mask to form a lead portion (not shown) of the gate electrode 14 without a photolithography process.

[Step-120]

Thereafter, a pair of source/drain electrodes 16 formed from a gold (Au) layer are formed on the gate insulating film 15 as seen in FIG. 1A. In particular, a titanium (Ti) layer (not shown) of approximately 0.5 nm thick as an adhesion layer and a gold (Au) layer of approximately 25 nm thick for the source/drain electrodes 16 are successively formed by vacuum deposition. When the film formation of such layers is performed, part of the gate insulating film 15 may be covered with a hard mask to form source/drain electrodes 16 without a photolithography process.

[Step-130]

Then, an active layer 20 is formed on the base 13 by application using solvent containing the composite material. In particular, solvent prepared in advance and containing the composite material is used and applied over the overall area by spin coating and then dried to form an active layer 20 on the gate insulating film 15 and the source/drain electrodes 16 as seen in FIG. 1B.

[Step-140]

Finally, a passivation film (not shown) is formed over the overall area to obtain a FET of the bottom gate/bottom contact type, particularly, a TFT.

In the electronic devices in the form of a FET according to the embodiment 1 described above and embodiments 2 to 4 hereinafter described, by applying predetermined voltages to the first and second electrodes (source/drain electrodes 16) and applying a voltage to the control electrode (gate electrode 14), a continuous accumulation layer for holes is formed in the active layer 20 while electrons are injected into the inorganic semiconductor fine particle 21 from one of the source/drain electrodes 16, that is, from the second electrode or drain electrode. Depending upon the voltage application state to the first and second electrodes, that is, to the source/drain electrodes 16, electrons are transmitted through inorganic semiconductor fine particles by hopping until they come, for example, to the other one of the source/drain electrodes, that is, the first electrode or source electrode. In this manner, in the present electronic device, the current to flow through the active layer 20 can be controlled or modulated by applying a voltage to the control electrode, that is, to the gate electrode.

Embodiment 2

The embodiment 2 is a modification to the embodiment 1. In the embodiment 2, the electronic device is a FTE, particularly, a TFT, of the bottom gate/top contact type. The field effect transistor of the embodiment 2 includes, as seen in FIG. 2b, (a) a gate electrode 14 (corresponding to the control electrode) formed on a substrate 10, (b) a gate insulating film 15 (corresponding to the insulating layer and also to the base 13) formed on the gate electrode 14 and the substrate 10, (c) a channel formation region forming layer 18 formed on the gate insulating film 15 and including a channel formation region 17 formed from an active layer 20, and (d) a pair of source/drain electrodes 16 (corresponding to the first and second electrodes) formed on the channel formation region forming layer 18.

In the following, an outline of a producing method for the electronic device in the form of a field effect transistor is described with reference to FIGS. 2A and 2B.

[Step-200]

First, a gate electrode 14 is formed on a substrate 10 in a similar manner as at the "step-100" of the embodiment 1. Then, a gate insulating film 15 corresponding to the base 13 is formed on a support which includes the gate electrode 14, more particularly, on the insulating film 12, in a similar manner as at the "step-120" of the embodiment 1.

[Step-210]

Figure 2A:
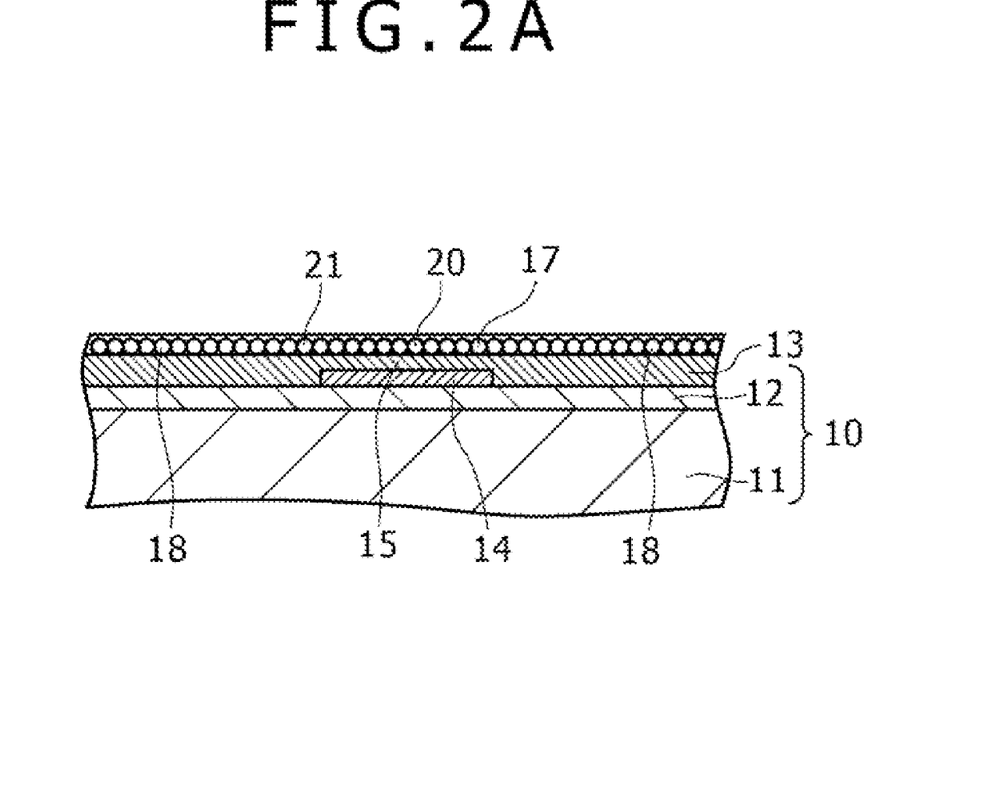
FIGS. 2A and 2B are schematic partial cross sectional views of substrate and associated components of another electronic device to which an embodiment is applied illustrating an outline of a producing process of the electronic device.
Figure 2B:
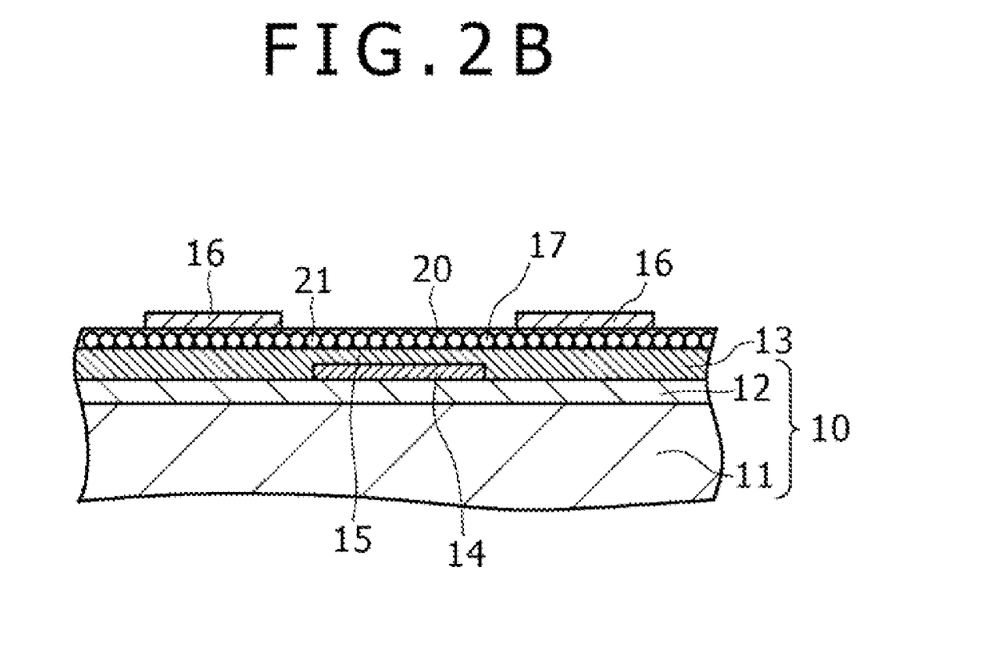

Then, an active layer 20 is formed on the base 13 as seen in FIG. 2A in a similar manner as at the "step-130" of the embodiment 1. The channel formation region forming layer 18 including the channel formation region 17 can be formed in this manner.

[Step-220]

Thereafter, a pair of source/drain electrodes 16 are formed on the channel formation region forming layer 18 in such a manner that the channel formation region 17 is positioned therebetween as seen in FIG. 2b. More particularly, a titanium (Ti) layer (not shown) as an adhesion layer and a gold (Au) layer as source/drain electrodes 16 are successively formed by vacuum deposition in a similar manner as at the step-120 of the embodiment 1. When those layers are formed, part of the channel formation region forming layer 18 may be covered with a hard mask so that the source/drain regions 16 are formed without a photolithography process.

[Step-230]

Finally, a passivation film (not shown) is formed over the overall area thereby to complete the semiconductor device of the embodiment 2.

Embodiment 3

Figure 3A:
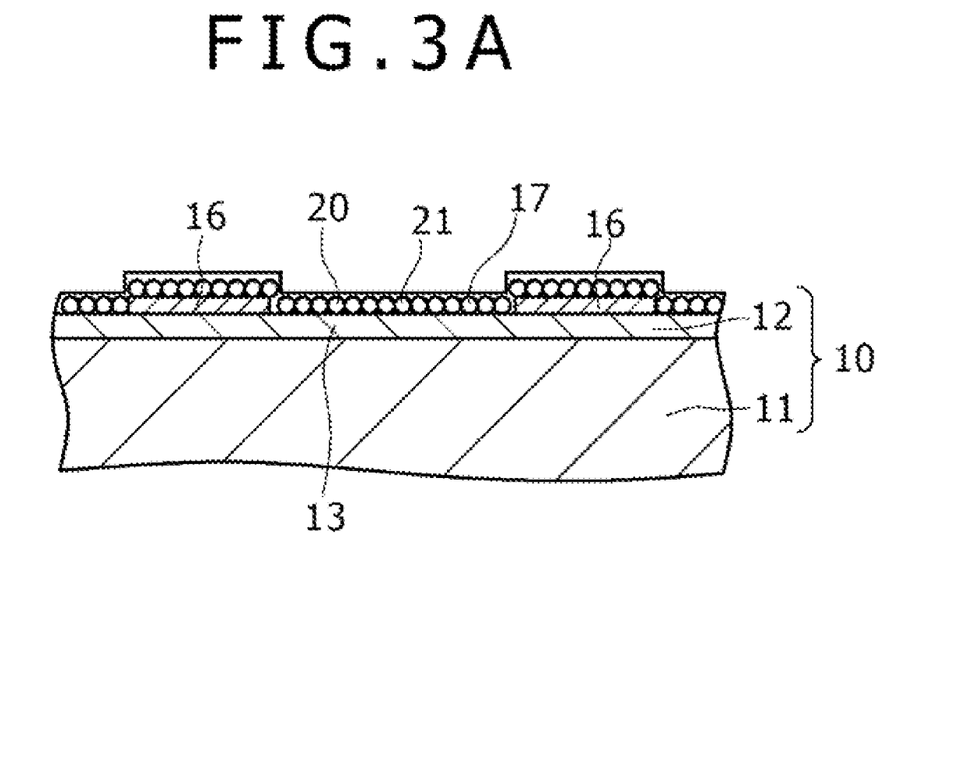
FIGS. 3A and 3B are schematic partial cross sectional views of substrate and associated components of a further electronic device to which an embodiment is applied illustrating an outline of a producing process of the electronic device.
Figure 3B:
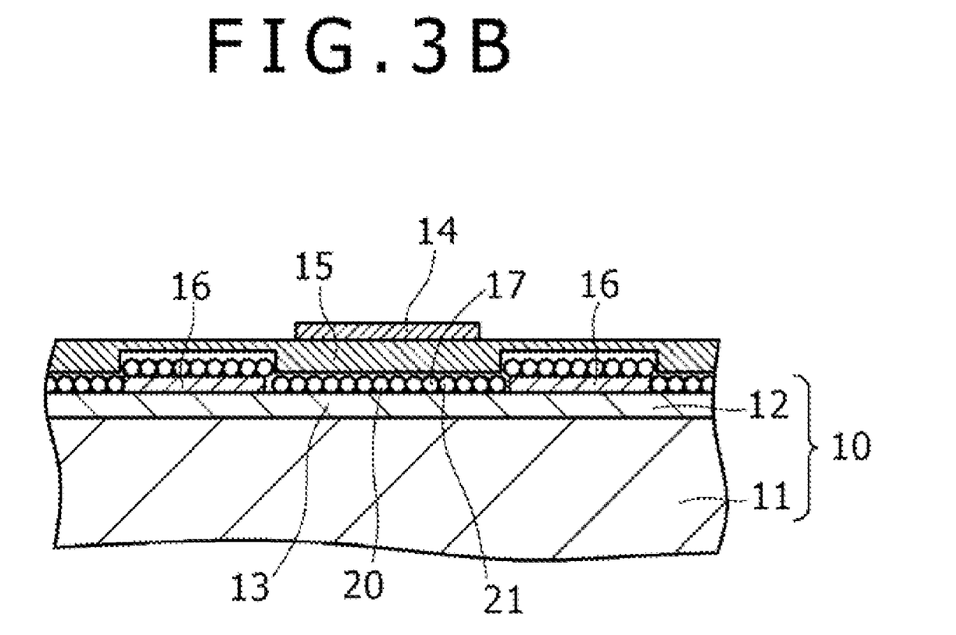

Also the embodiment 3 is a modification to the embodiment 1. In the embodiment 3, the electronic device is a FET, particularly, a TFT, of the top gate/bottom contact type. The field effect transistor of the embodiment 2 includes, as seen in FIG. 3B, (a) a pair of source/drain electrodes 16 (corresponding to the first and second electrodes) formed on an insulating film 12 corresponding to the base 13, (b) a channel formation region 17 formed on the base 13 between the source/drain electrodes 16 and formed from an active layer 20, (c) a gate insulating film 15 (corresponding to the insulating layer) formed on the source/drain electrodes 16 and the channel formation region 17, and (d) a gate electrode 14 (corresponding to the control electrode) formed on the gate insulating film 15.

In the following, an outline of a producing method for the electronic device in the form of a field effect transistor according to the embodiment 3 is described with reference to FIGS. 3A and 3B.

[Step-300]

First, a pair of source/drain electrodes 16 are formed on an insulating film 12, which corresponds to the base 13, by a method similar to that at the step-120 of the embodiment 1. Then, an active layer 20 is formed on the base 13, or more particularly on the insulating film 12, including the source/drain regions 16 in a similar manner as at the step-130 in the embodiment 1 as seen in FIG. 3A.

[Step-310]

Then, a gate insulating film 15 is formed by a method similar to that at the step-110 of the embodiment 1. Thereafter, a gate electrode 14 is formed at a portion of the gate insulating film 15 above the channel formation region 17 as seen in FIG. 3B by a method similar to that at the step-100 of the embodiment 1.

[Step-320]

Finally, a passivation film not shown is formed over the overall area thereby to complete the semiconductor device of the embodiment 3.

Embodiment 4

Also the embodiment 4 is a modification to the embodiment 1. In the embodiment 4, the electronic device is a FET, particularly, a TFT, of the top gate/top contact type. The field effect transistor of the embodiment 4 includes, as seen in FIG. 4C, (a) a channel formation region forming layer 18 formed on an insulating film 12 which corresponds to the base 13 and including a channel formation region 17 formed from an active layer 20, (b) a pair of source/drain electrodes 16 (corresponding to the first and second electrodes) formed on the channel formation region forming layer 18, (c) a gate insulating film 15 (corresponding to the insulating layer) formed on the source/drain electrodes 16 and the channel formation region 17, and (d) a gate electrode 14 (corresponding to the control electrode) formed on the gate insulating film 15.

In the following, an outline of a producing method for the electronic device in the form of a field effect transistor of the embodiment 4 is described with reference to FIGS. 4A to 4C.

[Step-400]

Figure 4A:
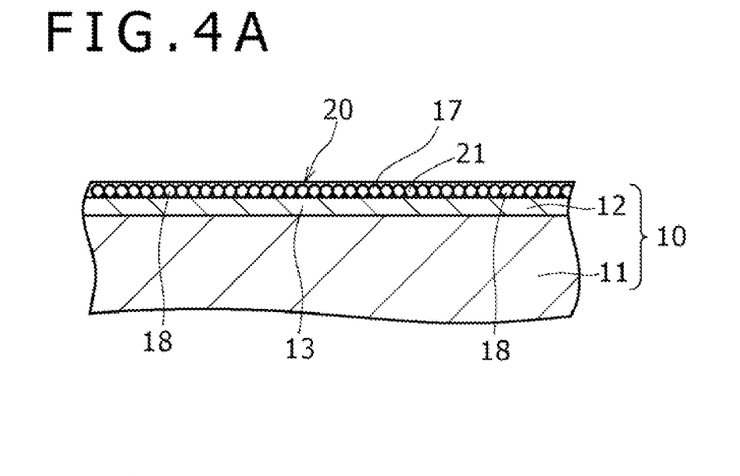
FIGS. 4A to 4C are schematic partial cross sectional views of substrate and associated components of a still further electronic device to which an embodiment is applied illustrating an outline of a producing process of the electronic device.

First, an active layer 20 is formed on a base 13, or more particularly, on an insulating film 12 as seen in FIG. 4A in a similar manner as at the step-130 of the embodiment 1.

[Step-410]

Figure 4B:
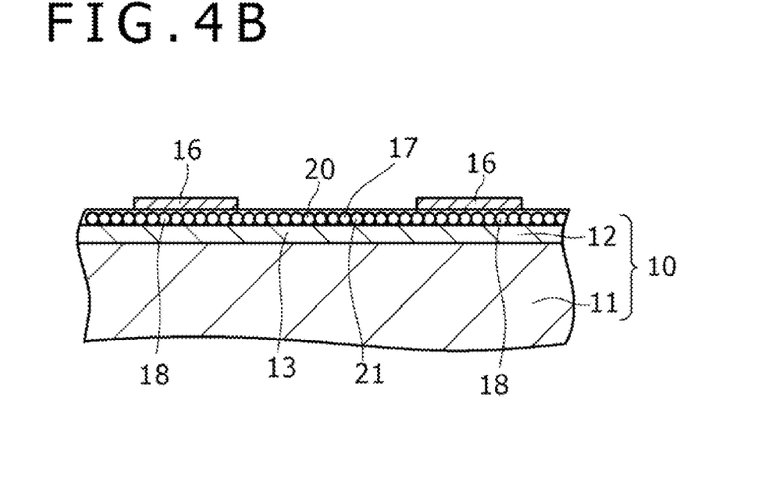
Figure 4C:
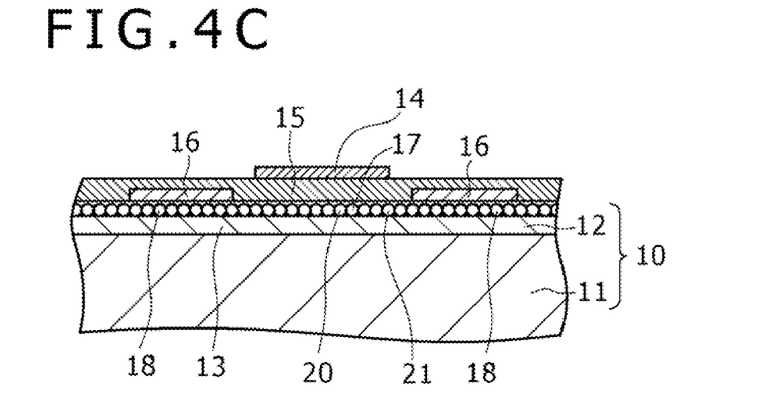

Then, a pair of source/drain electrodes 16 are formed on the channel formation region forming layer 18 as seen in FIG. 4B by a method similar to that at the step-120 of the embodiment 1.

[Step-420]

Thereafter, a gate insulating film 15 is formed by a method similar to that at the step-110 of the embodiment 1. Then, a gate electrode 14 is formed at a portion of the gate insulating film 15 above the channel formation region 17 as seen in FIG. 4C by a method similar to that at the step-100 of the embodiment 1.

[Step-430]

Finally, a passivation film (not shown) is formed over the overall area thereby to complete the semiconductor device of the embodiment 4.

Embodiment 5

Also the embodiment 5 is a modification to the embodiment 1. The electronic device of the embodiment 5 includes a light emitting element wherein the active layer 20 emits light upon application of a voltage to a control electrode (gate electrode 14) and first and second electrodes (source/drain electrodes 16). It is to be noted that light of any of the three colors of red, green and blue can be emitted basically by selecting the size of inorganic semiconductor fine particles. For example, if the inorganic semiconductor fine particles are made of CdSe/ZnS, then where the diameter of the inorganic semiconductor fine particles is approximately 3 nm, blue light is emitted; where the diameter is approximately 5 nm, green light is emitted; and where the diameter is approximately 7 nm, red light is emitted.

Also in the embodiment 5, the inorganic semiconductor fine particles 21, alkyl chain and organic semiconductor molecule bonded to the other end of the alkyl chain may be similar to those in the embodiment 1.

The particular configuration of the electronic device of the embodiment 5 may be similar to that of any of the electronic devices according to the embodiments 1 to 4 described hereinabove, and therefore, description of the particular configuration is omitted herein to avoid redundancy. It is to be noted that, in the electronic device of the embodiment 5, an electron transport layer or a hole transport layer as is required in the organic electroluminescence display apparatus in the past is not required.

In the electronic device of the embodiment 5, holes and electrons are re-combined in the composite material to emit fluorescent light depending upon the voltage application state upon the control electrode and the first and second electrodes (gate electrode 14 and source/drain electrodes 16) as described hereinabove. The fluorescent light color depends upon the particle size of the inorganic semiconductor fine particles 21 or depends upon the voltage application state (bias) to the first and second electrodes (source/drain electrodes 16). Accordingly, the color of light emission can be controlled by controlling the voltage application state (bias) to the first and second electrodes (source/drain electrodes 16) or by disposing the composite material formed from inorganic semiconductor fine particles having a desired particle size in a desired region. For example, if electronic devices which emit red light, electronic devices which emit green light and electronic devices which emit blue light are arrayed, for example, in a delta array, a stripe array, a diagonal array or a rectangle array, then a color image can be displayed. It is to be noted that the electronic device may be formed so as to function as a photo-electric conversion element wherein current flows between the first and second electrodes, that is, between the source/drain electrodes 16, upon irradiation of light upon the active layer 20. In this instance, the electronic device can function as a solar cell if the material for the first and second electrodes is selected suitably. Or, the electronic device can function as an image sensor having different sensitivities to the three colors of red, green and blue by suitably selecting the size of the inorganic semiconductor fine particles.

Embodiment 6

Figure 5:
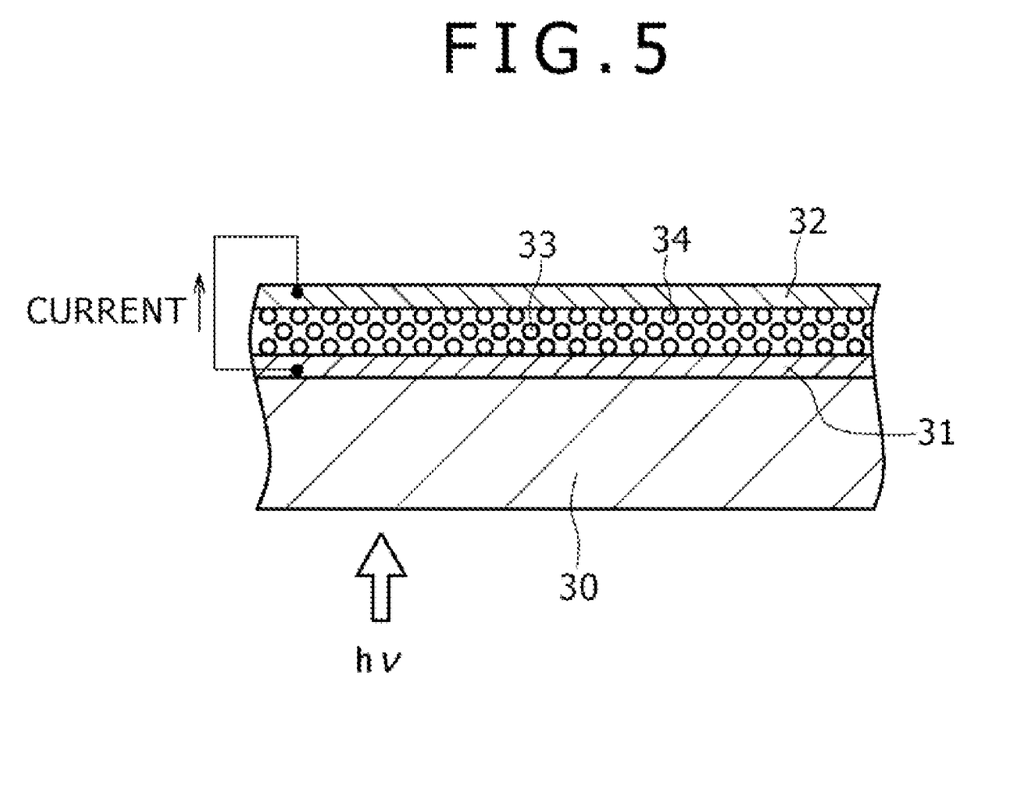
FIG. 5 is a schematic partial cross sectional view of a yet further electronic device to which an embodiment is applied.

The embodiment 6 relates to an electronic device and a producing method for the electronic device. The electronic device of the embodiment 6 is of the two-terminal type and includes (A) a first electrode 31 and a second electrode 32, and (B) an active layer 33 provided between the first electrode 31 and the second electrode 32.

Electric power is generated by irradiation of light upon the active layer 33. In other words, the electronic device of the embodiment 6 functions as a solar cell. Or, the electronic device of the embodiment 6 functions as a light emitting element wherein the active layer 33 emits light upon application of a voltage to the first electrode 31 and the second electrode 32.

The active layer 33 is composed of an aggregate of a composite material formed from inorganic semiconductor fine particles 34 covered with a protective layer. The protective layer is same as that described hereinabove with reference to FIG. 1C except that the reference numeral of the inorganic semiconductor fine particles is different. The protective layer is formed from alkyl chain each having, at one end thereof, a functional group bonded to an inorganic semiconductor fine particles and an organic semiconductor molecule bonded to the other end of each of the alkyl chain. Here, particularly the inorganic semiconductor fine particles 34, alkyl chain and organic semiconductor molecule bonded to the other end of alkyl chain may be similar to those in the embodiment 1. Meanwhile, the first electrode 31 is made of a metal having a high work function, particularly made of ITO which passes light therethrough, and the second electrode 32 is made of a metal having a low work function, particularly made of aluminum (Al) or magnesium (Mg).

In the electronic device of the embodiment 6, the composite material which forms the active layer 33 has an interface potential at a pn junction portion thereof and includes a barrier field. Then, if light is irradiated upon the active layer 33 through the first electrode 31 or, depending upon the material used, through the second electrode 32, then holes and electrons generated in the composite material are separated from each other by the electric field, whereby a potential difference (photoelectromotive force) is generated. The generated holes are transmitted through the organic semiconductor fine particles in the protective layer which forms an outer shell of the composite material and finally come to the first electrode 31. Meanwhile, the electrons are transmitted through inorganic semiconductor fine particles by hopping and finally arrive at the second electrode 32. Since the second electrode 32 is made of a metal having a low work function, particularly made of aluminum (Al), the electrons are injected readily into the second electrode 32. In this manner, in the electronic device of the embodiment 6, when light is irradiated upon the active layer 33, electric power (photoelectromotive force) is generated. Further, since the inorganic semiconductor fine particles having the n-type conductivity can themselves inject electrons into the second electrode 32 from an optical excited state, the efficiency of the light sensitization action to the sunlight can be raised further.

Or, in the electronic device of the embodiment 6, electrons are injected, for example, from the second electrode 32 into the inorganic semiconductor fine particles depending upon the voltage application state to the first electrode 31 and the second electrode 32 as described hereinabove. The injected electrons are transmitted through the inorganic semiconductor fine particles by hopping and spread to the entire active layer 33. On the other hand, if holes are injected into the organic semiconductor molecule from the first electrode 31, then an intense electric field is generated on the interface between the inorganic semiconductor fine particles and the organic semiconductor molecule by the injection of the carriers (holes and electrons). Thus, the holes are injected from the organic semiconductor molecule into the inorganic semiconductor fine particles or the electros are injected from the inorganic semiconductor fine particles into the organic semiconductor molecule, whereupon excitons are produced and re-combined immediately to emit fluorescent light. It is to be noted that, in causing the electronic device of the embodiment 6 to function as a light emitting element, there is no such limitation to the materials for the first electrode 31 and the second electrode 32 that the material for the first electrode 31 is a metal having a high work function while the material for the second electrode 32 is a metal having a low work function. In other words, the first electrode 31 and the second electrode 32 may be formed from any material only if it has conductivity. Further, if the size of the inorganic semiconductor fine particles is set similar to that described hereinabove, for example, in connection with the embodiment 5, then emission of blue light, green light and red light can be achieved.

In production of the electronic device of the embodiment 6, a first electrode 31 made of ITO is formed by sputtering on a support member 30 made of an inorganic material such as, for example, glass and an organic high molecular material such as polyimide or polyethylene terephthalate. Then, a buffer layer (not shown) made of PEDOT/PSS is formed on the first electrode 31. Further, an active layer 33 is formed on the buffer layer by application such as, for example, spin coating using solution which uses organic solvent such as toluene, chloroform or dichloromethane and contains the composite material. Thereafter, a second electrode 32 of aluminum is formed on the active layer 33 by vacuum deposition. The electronic device of the embodiment 6 can be obtained in this manner.

While the present application has been described above in connection with preferred embodiments thereof, the present application is not restricted to the embodiments. The structure, formation conditions or production conditions of the electronic devices are illustrative and can be modified suitably. Where a field effect transistor (FET) which is an electronic device obtained in accordance with the present application is applied to and used with, for example, display apparatus or various electronic apparatus, a large number of FETs may be integrated on a base or a support member to form a monolithic integrated circuit, or such FETs may be cut so as to be individualized and used as discrete parts. In the electronic devices according to the embodiments 1 to 5 described hereinabove, electric power can be generated by irradiation of light upon the active layer. Therefore, if the material for the active layer is designed and selected suitably, then it is possible for a single electronic device to exhibit functions of three different electronic devices as a photoelectric conversion element including an organic solar cell, an organic transistor and an organic light emitting element.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electronic device of a three-terminal type, comprising:
   a control electrode;
   first and second electrodes; and
   an active layer provided between said first and second electrodes so as to face said control electrode with an insulating layer interposed therebetween;
   said active layer being formed from an aggregate of a composite material formed from inorganic semiconductor fine particles covered with a protective layer;
   said protective layer including an alkyl chain having, at one end thereof, a functional group directly bonded to an inorganic semiconductor fine particle and further having an organic semiconductor molecule directly bonded to the other end thereof.

2. The electronic device according to claim 1, wherein current to flow from said first electrode toward said second electrode through said active layer is controlled by a voltage applied to said control electrode.

3. The electronic device according to claim 2, wherein said electronic device includes a field effect transistor whose gate electrode is said control electrode, whose source/drain electrodes are said first and second electrodes, whose gate insulating layer is said insulating layer and whose channel formation region is said active layer.

4. The electronic device according to claim 1, wherein said electronic device is formed as a light emitting element wherein said active layer emits light in response to application of a voltage to said control electrode and said first and second electrodes.

5. The electronic device according to claim 1, wherein said electronic device is formed as a photo-electric conversion element wherein current flows between said first and second electrodes in response to irradiation of light upon said active layer.

6. The electronic device according to claim 1, wherein the alkyl chain is —$(CH_2)_n$— where n is an integer ranging from 3 to 18.

7. The electronic device according to claim 1, wherein said inorganic semiconductor fine particles have the n-type conductivity and said organic semiconductor molecule has the p-type conductivity.

8. The electronic device according to claim 1, wherein said organic semiconductor molecule is formed from a compound selected from a group of a condensation polycyclic aromatic compound, porphyrin-based derivative, a phenylvinyliden type conjugate oligomer and a thiophene type conjugate oligomer.

9. The electronic device according to claim 1, wherein the functional group provided at said one end of the alkyl chain is a compound selected from a group of a thiol radical —SH, an amino group —$NH_2$, a cyano radical
—NC, a carboxyl radical —COOH, a phosphoric radical and a phosphine oxide group —P=O.

10. The electronic device according to claim 1, wherein said inorganic semiconductor fine particles are fine particles of at least one kind selected from a group of CdS, CdSe, ZnS, CdSe/CdS, SdSe/ZnS, PbSe and ZnO.

11. An electronic device of a two-terminal type, comprising:
first and second electrodes; and
an active layer provided between said first and second electrodes;
said active layer being formed from an aggregate of a composite material formed from inorganic semiconductor fine particles covered with a protective layer;
said protective layer including an alkyl chain having, at one end thereof, a functional group directly combined to an inorganic semiconductor fine particle and further having an organic semiconductor molecule directly combined to the other end thereof;
said active layer generating electric power in response to light irradiated thereupon.

12. The electronic device according to claim 11, wherein said first electrode is made of a metal having a high work function while said second electrode is made of a metal having a low work function.

13. The electronic device according to claim 12, wherein said first electrode is made of ITO while said second electrode is made of aluminum or magnesium.

14. The electronic device according to claim 11, wherein the alkyl chain is —$(CH_2)_n$— where n is an integer ranging from 3 to 18.

15. The electronic device according to claim 11, wherein said inorganic semiconductor fine particles have the n-type conductivity and said organic semiconductor molecule has the p-type conductivity.

16. The electronic device according to claim 11, wherein said organic semiconductor molecule is formed from a compound selected from a group of a condensation polycyclic aromatic compound, porphyrin-based derivative, a phenylvinyliden type oligomer and a thiophene type oligomer.

17. The electronic device according to claim 11, wherein the functional group provided at said one end of the alkyl chain is a compound selected from a group of a thiol radical —SH, an amino group —$NH_2$, a cyano radical
—NC, a carboxyl radical —COOH, a phosphoric radical and a phosphine oxide group —P=O.

18. The electronic device according to claim 11, wherein said inorganic semiconductor fine particles are fine particles of at least one kind selected from a group of CdS, CdSe, ZnS, CdSe/CdS, SdSe/ZnS, PbSe and ZnO.

19. An electronic device of a two-terminal type, comprising:
first and second electrodes; and
an active layer provided between said first and second electrodes;
said active layer being formed from an aggregate of a composite material formed from inorganic semiconductor fine particles covered with a protective layer;
said protective layer including an alkyl chain having, at one end thereof, a functional group directly combined to an inorganic semiconductor fine particle and further having an organic semiconductor molecule directly combined to the other end thereof;
said active layer emitting light in response to application of a voltage to said first and second electrodes.

20. The electronic device according to claim 19, wherein the alkyl chain is —$(CH_2)_n$— where n is an integer ranging from 3 to 18.

21. The electronic device according to claim 19, wherein said inorganic semiconductor fine particles have the n-type conductivity and said organic semiconductor molecule has the p-type conductivity.

22. The electronic device according to claim 19, wherein said organic semiconductor molecule is formed from a compound selected from a group of a condensation polycyclic aromatic compound, porphyrin-based derivative, a phenylvinyliden type oligomer and a thiophene type oligomer.

23. The electronic device according to claim 19, wherein the functional group provided at said one end of the alkyl chain is a compound selected from a group of a thiol radical —SH, an amino group —$NH_2$, a cyano radical
—NC, a carboxyl radical —COOH, a phosphoric radical and a phosphine oxide group —P=O.

24. The electronic device according to claim 19, wherein said inorganic semiconductor fine particles are fine particles of at least one kind selected from a group of CdS, CdSe, ZnS, CdSe/CdS, SdSe/ZnS, PbSe and ZnO.

* * * * *